United States Patent [19]

Elsaessser et al.

[11] Patent Number: 5,368,975
[45] Date of Patent: Nov. 29, 1994

[54] POSITIVE-WORKING 1,2-QUINONE DIAZIDE RADIATION-SENSITIVE MIXTURE AND RECORDING MATERIAL CONTAINING URETHANE COMPOUND TO DIMINISH DEVELOPER SOLUBILITY

[75] Inventors: Andreas Elsaessser, Idstein; Hans W. Frass; Otfried Gaschler, both of Wiesbaden; Dieter Mohr, Budenheim; Gerhard Buhr, Koenigstein, all of Germany

[73] Assignee: Hoechst Aktiengesellschaft, Frankfurt am Main, Germany

[21] Appl. No.: 39,554

[22] Filed: Mar. 26, 1993

Related U.S. Application Data

[63] Continuation of Ser. No. 651,210, Feb. 6, 1991, abandoned.

[30] Foreign Application Priority Data

Feb. 15, 1990 [DE] Germany .............................. 4004719

[51] Int. Cl.$^5$ .............................................. G03F 7/023
[52] U.S. Cl. ..................................... 430/165; 430/191; 430/192
[58] Field of Search .......................... 430/191, 192, 165

[56] References Cited

U.S. PATENT DOCUMENTS 3,779,778 12/1973 Smith et al. .
3,869,292 3/1975 Peters .................................... 430/192

(List continued on next page.)

FOREIGN PATENT DOCUMENTS 0187517 7/1986 European Pat. Off. .
0327991 8/1989 European Pat. Off. .
739654 11/1955 United Kingdom .
1154749 6/1969 United Kingdom .
1561438 2/1980 United Kingdom .
2082339 3/1982 United Kingdom .
2171530 8/1986 United Kingdom .

OTHER PUBLICATIONS

Scott A. MacDonald et al., "Image Reversal: The Production of a Negative Image in a Positive Photoresist", Interface 82, 1982, San Diego, pp. 1-6.

Primary Examiner—Charles L. Bowers, Jr.
Assistant Examiner—Christopher G. Young
Attorney, Agent, or Firm—Foley & Lardner

[57] ABSTRACT

The invention relates to a usually positive-working radiation-sensitive mixture which contains as essential components a binder which is insoluble in water and soluble in aqueous-alkaline solutions, a 1,2-quinone diazide and a compound which diminishes the developer solubility of the exposed regions by heat treatment, in which the compound which diminishes the developer solubility which is present is at least one urethane of the formula I:

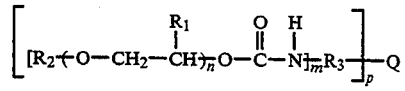

in which
  $R_1$ is hydrogen or methyl,
  $R_2$ is hydrogen, alkyl, substituted or unsubstituted aryl, or substituted or unsubstituted arylaminocarbonyl,
  $R_3$ is substituted or unsubstituted arylene or arylenealkylene,
  Q is hydrogen, $-CH_{4-p}$, or $-CR_5R_6$ in which $R_5$ and $R_6$ can be identical or different and are selected from the group consisting of hydrogen, alkyl and aryl, carbonyl, oxygen, sulfur or sulfonyl,
  m is 1, 2 or 3,
  n is at least 1 and not more than 50, and
  is 1, 2 or 3.

The mixture is suitable for producing a radiation-sensitive recording material which has a long shelf life in combination with high radiation sensitivity and has a broad image reversal range in a process for producing relief images.

15 Claims, No Drawings

U.S. PATENT DOCUMENTS

| | | | |
|---|---|---|---|
| 4,104,070 | 8/1978 | Moritz et al. | 430/325 |
| 4,189,323 | 2/1980 | Buhr | 430/281 |
| 4,196,003 | 4/1980 | Watanabe | 430/193 |
| 4,212,970 | 7/1980 | Iwasaki | 542/455 |
| 4,356,255 | 10/1982 | Tachikawa et al. | 430/325 |
| 4,544,627 | 10/1985 | Takahashi et al. | 430/325 |
| 4,576,901 | 3/1986 | Stahlhofen et al. | 430/325 |
| 4,581,321 | 4/1986 | Stahlhofen | 430/325 |
| 4,678,737 | 7/1987 | Schneller et al. | 430/270 |
| 4,696,891 | 9/1987 | Guzzi | 430/325 |
| 4,775,609 | 10/1988 | McFarland | 430/325 |
| 4,889,787 | 12/1989 | Musser | 430/191 |
| 4,889,788 | 12/1989 | Stahlhofen et al. | 430/191 |
| 4,889,789 | 12/1989 | Stahlhofen | 430/191 |
| 4,898,803 | 2/1990 | Aoai et al. | 430/191 |
| 4,910,119 | 3/1990 | Schneller et al. | 430/192 |
| 4,950,582 | 8/1990 | Aoai et al. | 430/191 |
| 4,996,301 | 2/1991 | Wilharm et al. | 534/556 |
| 5,024,922 | 6/1991 | Moss et al. | 430/330 |

POSITIVE-WORKING 1,2-QUINONE DIAZIDE RADIATION-SENSITIVE MIXTURE AND RECORDING MATERIAL CONTAINING URETHANE COMPOUND TO DIMINISH DEVELOPER SOLUBILITY

This application is a continuation of application Ser. No. 07/651,210, filed Feb. 6, 1991, now abandoned.

BACKGROUND OF THE INVENTION

The present invention relates to a radiation-sensitive mixture, a recording material produced therefrom and a process for the production of relief recordings. The invention starts with a normally positive-working, but also, depending on processing, negative-working, radiation-sensitive mixture which contains as essential components a polymer binder which is insoluble in water and soluble in aqueous/alkaline solutions and a 1,2-quinone diazide.

Radiation-sensitive mixtures are positive-working if their solubility in a developer solution is increased through irradiation. As a result of known process variations, the mixtures can also be reversed to give negative copies of the originals. This processing mode requires a heat treatment after the imagewise exposure, in which the material is brought, in a suitable apparatus, to a certain temperature for a certain amount of time. This converts the mixture in the irradiated regions from a developer-soluble into a usually no longer radiation-sensitive, developer-insoluble state.

The individual steps necessary for negative processing are imagewise irradiation of the copying layer containing the mixture, heat treatment, irradiation over the entire surface and subsequent development. A variation of this process is described in U.S. Pat. No. 4,544,627 in which the imagewise differentiation takes place during the heat step, the procedure entailing irradiation of the copying layer containing the mixture over the entire surface, imagewise heating, for example, by means of IR laser beams, and development.

Although it is, in principle, possible to carry out this process, usually called image reversal, without having to add special additives to the mixture, as described in EP 131,238, corresponding to U.S. Pat. No. 4,576,901, it is generally the rule to add a substance which broadens the image reversal range and diminishes the attack of the developer solution on the regions made developer-insoluble after the conversion. In this regard, image reversal range is understood to mean the width of temperature range within which the conversion can be carried out or the tolerance width of the time necessary for the conversion.

The mixture additives to be used can be divided into two groups. The first group of additives causes a cross-linking reaction in the light-sensitive mixture due to heat in the presence of the indene carboxylic acid formed upon irradiation. The second group of additives reduce the energy necessary for decarboxylation of the acid formed upon irradiation (S. A. MacDonald et al., "Image Reversal: The Production of a Negative Image in a Positive Photoresist", INTERFACE 82, San Diego 1982).

The first group includes resols (GB 2,082,339), alkoxymethyl- or glycidyl-substituted aromatics (EP 212,482), monomeric or oligomeric melamine- or urea-formaldehyde condensation products (EP 133,216, DE 3,711,264). The second group includes secondary or tertiary amines having a boiling point of greater than 200° C. (U.S. Pat. No. 4,196,003), ammonium salts (EP 141,400, corresponding to U.S. Pat. No. 4,696,891) and phosphonium salts (DE 3,437,687), monazoline (DE 2,529,054, corresponding to U.S. Pat. No. 4,104,070) and N-substituted ethylenediamines (DE 2,855,723), aminoalkoxy-s-triazines (DE 3,711,263), trisphenoxy-s-triazines (DE 3,725,949) and quinones or aromatic ketones (U.S. Pat. No. 4,356,255).

In a third process variation, the additive for broadening the image reversal range is not initially present in the radiation-sensitive layer, but is added between the imagewise irradiation and heat treatment, such as is described, for example, in DE 3,541,451 and U.S. Pat. No. 4,775,609, in which the material is exposed to an ammonia atmosphere.

The fact that the mixture additives of the first group, which participate in an acid-catalyst crosslinking reaction, generally impair the shelf life of the mixture more strongly than those of the second group makes the latter the preferred additives.

The width of the processing range required in industry for image reversal is achieved by additives of the second group, such as, for example, the aminoalkoxy-s-triazines described in DE 3,711,263. However, it is unsatisfactory that the attack of the developer solution on the converted image regions is still relatively high. This can have the effect that, when the latent negative image is developed, a significant portion of the photoresist may in some cases be removed in these regions. As a result, the number of printed copies obtainable with a printing plate thus produced is lower and the developer contains a large amount of converted resist material, the solubility of which in the developer is in turn limited, resulting in premature and undesirable exhaustion of the developer.

SUMMARY OF THE INVENTION

It is therefore an object of the present invention to provide a radiation-sensitive mixture having a long shelf life and a broad image reversal range, which, after conversion, is less attacked by the developer than the known mixtures.

It is another object of the invention to provide a radiation-sensitive recording material having these characteristics, and a process for producing a relief recording from this material.

These and other objects according to the invention are accomplished by a radiation-sensitive mixture, comprising, in admixture, a binder that is insoluble in water and soluble in aqueous/alkaline solutions, a 1,2-quinone diazide, and at least one urethane compound which diminishes the developer solubility of exposed regions by heat treatment, the at least one urethane being represented by formula I:

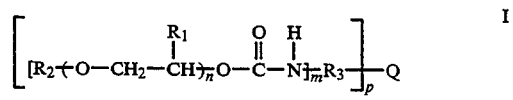

in which
R₁ is hydrogen or methyl,
R₂ is hydrogen, alkyl, substituted or unsubstituted aryl, or substituted or unsubstituted arylaminocarbonyl,
R₃ is substituted or unsubstituted arylene or arylenealkylene, Q is hydrogen, —CH$_{4-p}$, or —CR$_5$R$_6$ in which R$_5$ and R$_6$ can be identical or different and are selected from the group consisting of hydrogen, alkyl and aryl, carbonyl, oxygen, sulfur or sulfonyl, m is 1, 2 or 3, n is at least 1 and not more than 50, and p is 1, 2 or 3.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

The invention starts from a radiation-sensitive mixture which contains as essential components a binder which is insoluble in water and soluble in aqueous-alkaline solutions, a 1,2-quinone diazide and a compound which diminishes the developer solubility of the exposed regions by heat treatment. The mixture contains, as the compound which diminishes the developer solubility, at least one urethane of the formula I:

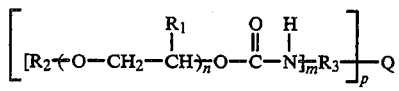

in which

R$_1$ is hydrogen or methyl,

R$_2$ is hydrogen, alkyl, substituted or unsubstituted aryl or substituted or unsubstituted arylaminocarbonyl, R$_3$ is substituted or unsubstituted arylene or arylenealkylene, Q is hydrogen, —CH$_{4-p}$, or —CR$_5$R$_6$ in which R$_5$ and R$_6$ can be identical or different and are selected from the group consisting of hydrogen, alkyl and aryl, carbonyl, oxygen, sulfur or sulfonyl, m is 1, 2 or 3, n is at least 1 and not more than 50, and p is 1, 2 or 3.

Preference is given to compounds of the formula I in which:

R$_1$ is hydrogen or methyl,

R$_2$ is hydrogen, C$_1$-C$_2$-alkyl, phenyl, naphthyl, or phenylaminocarbonyl, which can be substituted by alkyl, R$_3$ is phenylene, which can be substituted by alkyl, Q is hydrogen or methylene, m is 1 or 2, n is at least 3 and not more than 25, and p is 1 or 2.

Particularly preferred are compounds of formula I in which:

R$_1$ is hydrogen,

R$_2$ is phenyl, phenylaminocarbonyl, which can be substituted by alkyl,

R$_3$ is phenylene,

Q is hydrogen, m is 1, n is at least 3 and not more than 25, and p is 1.

The preparation of the urethane compounds according to the invention is carried out in a simple manner by reacting the corresponding mono- or bifunctional alcohols with mono-, bi- or trifunctional isocyanates.

Examples of urethane compounds according to the invention are reaction products of monofunctional alcohols, such as ethylene glycol monomethyl or -ethyl ethers, propylene glycol monomethyl or -ethyl ethers, di-, tri- or tetraethylene or propylene glycol monomethyl, -ethyl or -butyl ethers, fatty alcohol ethoxylates, such as Genapol ®️ types from Hoechst AG, alkylphenol ethoxylates, such as nonylphenol ethoxylates (Arkopal ®️-N, Hoechst AG), tributylphenol ethoxylates, such as Sapogenat ®️-T, Hoechst AG), monobutyl ethers of ethylene oxide/propylene oxide copolymers (Polyglykol ®️-B types, Hoechst AG) and/or bifunctional alcohols, such as mono-, di-, tri-, tetra-, pentaethylene or propylene glycols, ethylene/propylene block polymers, such as Genapol ®️-PF or Pluriol ®️-PE types from Hoechst or BASF AG, with monofunctional isocyanates, such as phenyl, 3-or 4-chlorophenyl, 3,4-dichlorophenyl, 3-trifluoromethyl phenyl, 4-methylphenyl, 4-isopropylphenyl, 1-naphthyl isocyanate and/or bifunctional isocyanates, such as 2,4- or 2,6-toluene diisocyanate, 4,4'- or 2,4'- or 2,2'-diphenylmethane diisocyanate, or 1,5-naphthyl diisocyanate and/or trifunctional isocyanates, such as triphenylmethane triisocyanate, the adduct from trimethyl propane and toluene diisocyanate (Desmodur ®️, Bayer AG).

The concentration of the urethanes according to the invention in the radiation-sensitive mixture can vary within relatively wide limits. Generally, the amount is about 0.5 to 30, preferably between about 1 and 25, percent by weight, relative to the weight of the non-volatile components of the radiation-sensitive mixture. In what follows, the composition of the radiation-sensitive mixtures and layers, the type of substrate and the further process steps of the processing of recording materials are described in more detail.

The radiation-sensitive mixture according to the invention contains as the 1,2-quinone diazide preferably a 1,2-naphthoquinone-2-diazide derivative which has an electronegative substituent, such as an aryloxysulfonyl group, in the 4- or 5-position. The 1,2-quinone diazide used in particular is a 4-sulfonic ester or -sulfonamide of 1,2-naphthoquinone-2-diazide. Suitable compounds of this type are known and described, for example, in DE 938,233, which corresponds to GB 739,654 and DE 2,547,905, which corresponds to GB 1,561,438.

The amount of 1,2-quinone diazide compounds is generally about 3 to 50, preferably about 7 to 35 percent by weight, relative to the overall solid content of the mixture.

The binders that are used are polycondensation products or polymers having free phenolic hydroxyl groups, the amount of phenolic hydroxyl groups preferably being in the range from about 1 to 10 mmol/g of binder. Examples of polycondensation products are phenolic resins of the novolak type or hydroxyl-substituted aramides. Examples of polymers include homo- and copolymers of vinylphenols (DE 2,322,230, which corresponds to U.S. Pat. No. 3,869,292 and DE 3,406,927, which corresponds to U.S. Pat. No. 4,678,737), polymers of the esters of acrylic acids with phenols (JP 76/36 129 and EP 212,439) or copolymers of hydroxyphenyl maleimides (EP 187,517). The glass transition temperatures of these binders vary, depending on the area of application. For dry resist applications, where easy lamination is required, glass transition temperatures of 100° C. or less are advantageous. When used in planographic printing or in the manufacture of microelectronic circuits, glass transition temperatures of 100° C. or more are favoured. The amount of binder is generally about 20 to 90, preferably about 50 to 85 percent by weight of the non-volatile components of the mixture.

In addition, a large number of other oligomers and polymers can be used, for example, vinyl polymers, such as polyvinyl acetals, polymethacrylates, polyacrylates, polyvinyl ethers and polyvinylpyrrolidones, which themselves can be modified by comonomers. The most favorable proportion of these additives depends on the technical requirements and their effect on the development conditions and generally is not more than about 20 percent by weight of the binder having pendant phenolic groups. The light-sensitive layer can also contain small amounts of substances, such as polyglycols, cellulose ethers, for example, ethyl cellulose, wetting agents and finely-divided pigments for special requirements, such as flexibility, adhesion, gloss and the like. Furthermore, soluble or even finely-divided dispersible dyes and, depending on the particular application, UV absorbers can be added to the light-sensitive mixture.

Depending on the type of dye which is added to the mixture, it may be reasonable, in order to obtain a visible copy of the original on the recording material directly after exposure, to add photochemical acid formers, to enhance the exposure contrast.

Suitable light-sensitive components which form a strong acid upon exposure are a large number of known compounds and mixtures, such as phosphonium, sulfonium and iodonium salts, halogen compounds and organometal/organohalogen combinations.

In principle, any organic halogen compounds known as photochemical free radical initiators, for example, those having at least one halogen atom on a carbon atom or on an aromatic ring, are useful as halogen-containing light-sensitive compounds forming hydrohalic acid (U.S. Pat. No. 3,779,778). Of these compounds, the s-triazine derivatives .containing halomethyl groups, in particular trichloromethyl groups, having an aromatic or unsaturated substituent on the triazine ring, such as those described in DE 2,718,259, which corresponds to U.S. Pat. No. 4,189,323, are preferred. 2-Trichloromethyl-1,3,4-oxadiazoles as described in DE 2,851,471, corresponding to U.S. Pat. No. 4,212,970, are also suitable. The effect of these halogen-containing compounds can also be affected and increased spectrally by known sensitizers.

The invention also relates to a radiation-sensitive recording material comprising a substrate and a radiation-sensitive layer applied thereto, which layer contains a radiation-sensitive mixture according to the invention.

To coat a suitable substrate, the mixtures are generally dissolved in a solvent. The solvent chosen must be adapted to the intended coating process, the layer thickness and the drying conditions Suitable solvents for the mixture according to the invention are ketones, such as methylethyl ketone, chlorinated hydrocarbons, such as trichloroethylene and 1,1,1-trichloroethane, alcohols, such as n-propanol, ethers, such as tetrahydrofuran, alcohol ethers, such as ethylene glycol monoethyl ether, and esters, such as butyl acetate. It is also possible to use mixtures which for certain purposes additionally contain solvents, such as acetonitrile, dioxane or dimethylformamide. In principle, all solvents can be used which do not react irreversibly with the layer components. Partial ethers of glycols, in particular ethylene glycol monomethyl ether and propylene glycol monomethyl ether by themselves or in a mixture are particularly preferred.

In most cases, metals are used as substrates for layer thicknesses below about 10 $\mu$m. For offset printing plates, suitable substrates include mill-finished, mechanically and/or electrochemically roughened and optionally anodized aluminum, which may have been also chemically pretreated, for example, with polyvinylphosphonic acid, silicates, phosphates, hexafluorozirconates or with hydrolyzed tetraethyl orthosilicate. The substrate is coated in a known manner by spin-coating, spraying, dip-coating, roller application, by means of slot dyes, knives or by curtain coating.

For exposure, the customary light sources, such as fluorescent lamps, pulsed xenon lamps, metal halide-doped mercury vapour high-pressure lamps and carbon-arc lamps can be used.

Exposure or irradiation in this description is understood to mean the effect of actinic electromagnetic radiation in the wavelength region below about 500 nm. Any radiation sources emitting in this wavelength region are suitable.

Laser-beam devices, in particular automatic processing units, which contain, for example, an argon or krypton ion laser as the radiation source can advantageously be used. Furthermore, the irradiation can be carried out using electron beams. X-ray beams can also be used for image generation.

The imagewise exposed or irradiated layer can be removed in a known manner using virtually the same developers used for commercially-available naphthoquinone diazide layers and photoresists, or the materials according to the invention can advantageously be adapted in their copying behavior to the known auxiliaries such as developers and programmed spray developing instruments. The aqueous development solutions can contain, for example, alkaline metal phosphate, alkaline metal silicate, alkaline metal hydroxide, wetting agents, and if desired, smaller portions of organic solvents. In certain cases, solvent/water mixtures are also usable as developers. The most favorable developer can be readily determined by experiments involving the layer used in each case. If desired, the development can be aided mechanically.

If used as printing plates, the developed plates can be heated to elevated temperatures for a short time, such as described for diazo layers in GB 1,154,749, in order to increase the resistance during printing and the resistance to washing fluids, correcting fluids and UV-curable printing inks.

The radiation-sensitive recording material according to the invention is usually processed as positive-working material. However, it can also be processed in negative-working mode and as a combination of both process types, known as photocomposing. The material according to the invention is very particularly suitable for producing a negative recording material of a usually positive-working radiation-sensitive type. In this process, a substrate having a radiation-sensitive layer thereon is imagewise exposed, heat treated, blanket exposed without an original, and subsequently developed. Preferably, the heat treatment is carried out at temperatures between about 80° and 150° C. for times between 10 seconds and 5 minutes.

The invention provides a radiation-sensitive mixture and recording material having a long shelf life in combination with good radiation sensitivity, which has a technically desirable broad image reversal range and image regions which are much less attacked after conversion by the developer than is the case for known materials.

Below, examples of the preferred embodiments are given. In the examples, parts by weight (pbw) relate to parts by volume (pbv) as g relates to ccm. Percentages and amounts are by weight, unless stated otherwise.

EXAMPLE 1

A coating solution is prepared from approximately

| | |
|---|---|
| 8.0 pbw | of an m-cresol-formaldehyde novolak having an average molecular weight of 6,000, |
| 1.6 pbw | of an esterification product from 1 mol of 4-chlorosulfonyl-1,2-naphthoquinone-2-diazide and 1 mol of p-cumylphenol, |
| 0.4 pbw | of an additive according to Table 1 and 2, |
| 0.1 pbw | of Crystal Violet, color index (C.I.) 42555, |
| 0.02 pbw | of Sudan Yellow GGN, C.I. 11021, and |
| 100 pbw | of a solvent mixture of tetrahydrofuran and propylene glycol monomethyl ether (55:45). |

This solution is applied to an aluminum foil which has been toughened in hydrochloric acid, anodized in sulfuric acid and made hydrophilic with polyvinylphosphonic acid by spin-coating. Two minutes of drying at 100° C. gives a layer thickness of 2 μm.

The printing plates are exposed under a 5 kW metal halide lamp at a distance of 110 cm through a continuous-tone step wedge having 13 density steps of 0.15 each (exposure wedge "BK 01" from Hoechst AG) for 65 seconds, converted at 130° C. in a circulating-air oven for 2 minutes, fully exposed without an original for 45 seconds and then developed in the following developer for 1 minute:

7.6 pbw of $K_2SiO_3$
1.2 pbw of $K_3PO_4$
91.3 pbw of $H_2O$.

Table 2 gives the continuous-tone wedge reproduction from the fully covered step to the first step which exhibits fogging. The table also shows which open step is obtained if development is carried out after the imagewise exposure, i.e., in a positive processing mode.

TABLE 1

| Compound No. | Urethane compounds according to the invention | | | n | m | p | Q |
| | $R^2$ | $R^1$ | $R^3$ | | | | |
|---|---|---|---|---|---|---|---|
| 1 |  | H | 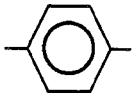 | 10 | 1 | 1 | H |
| 2 | 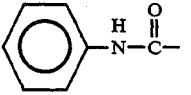 | $C_4H_9$ |  | 10 | 1 | 1 | H |
| 3 | 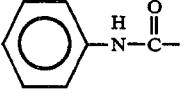 | H | 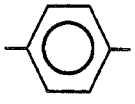 | 3 | 1 | 1 | H |
| 4 | 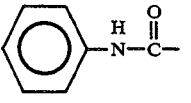 | H | 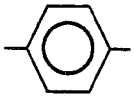 | 4 | 1 | 1 | H |
| 5 | 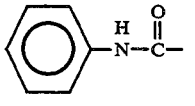 | H |  | 6.4 | 1 | 1 | H |
| 6 | 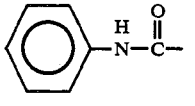 | H | | 8.7 | 1 | 1 | H |
| 7 | 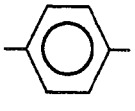 | H | | 22.3 | 1 | 1 | H |

TABLE 1-continued

Urethane compounds according to the invention

| Compound No. | R² | R¹ | R³ | n | m | p | Q |
|---|---|---|---|---|---|---|---|
| 8 | C₆H₅-NH-C(O)- | H | -C₆H₄- | 45.0 | 1 | 1 | H |
| 9 | H | H | -C₆H₄- | 8.7 | 1 | 1 | H |
| 10 | H | H | -C₆H₄- | 8.7 | 1 | 2 | CH₂ |
| 11 | H | H | -C₆H₄- | 8.7 | 1 | 3 | CH |
| 12 | H | H | -C₆H₄- | 8.7 | 2 | 1 | CH₃ |
| 13 | C₆H₅-NH-C(O)- | CH₃ | -C₆H₄- | 3 | 1 | 1 | H |
| 14 | C₆H₅-NH-C(O)- | CH₃ | -C₆H₄- | 7.5 | 1 | 1 | H |
| 15 | C₆H₅-NH-C(O)- | CH₃ | -C₆H₄- | 16.9 | 1 | 1 | H |
| 16 | 3-CF₃-C₆H₄-NH-C(O)- | H | -C₆H₃(CF₃)- | 6.4 | 1 | 1 | H |
| 17 | 3-Cl-4-CH₃-C₆H₃-NH-C(O)- | H | -C₆H₂(CH₃)(Cl)- | 6.4 | 1 | 1 | H |
| 18 | (CH₃)₂CH-C₆H₄- | H | -C₆H₃-CH(CH₃)₂ | 6.4 | 1 | 1 | H |
| 19 | CH₃ | H | -C₆H₄- | 3 | 1 | 2 | S |

TABLE 1-continued

| Compound No. | Urethane compounds according to the invention | | | n | m | p | Q |
| --- | --- | --- | --- | --- | --- | --- | --- |
| | $R^2$ | $R^1$ | $R^3$ | | | | |
| 20 | CH$_3$ | H | (naphthalene group) | 3 | 2 | 1 | H |

TABLE 2

| Example No. | Additive | Negative Processing | Positive Processing |
| --- | --- | --- | --- |
| 1-1 | 1 (Table 1) | 2-5 | 2 |
| 1-2 | 2 | 2-5 | 2 |
| 1-3 | 3 | 2-5 | 2 |
| 1-4 | 4 | 2-5 | 2 |
| 1-5 | 5 | 2-5 | 2 |
| 1-6 | 6 | 2-5 | 2 |
| 1-7 | 7 | 2-5 | 2 |
| 1-8 | 8 | 2-5 | 2 |
| 1-9 | 9 | 2-5 | 2 |
| 1-10 | 10 | 2-5 | 2 |
| 1-11 | 11 | 2-5 | 2 |
| 1-12 | 12 | 2-5 | 2 |
| 1-13 | 13 | 2-5 | 2 |
| 1-14 | 14 | 2-5 | 2 |
| 1-15 | 15 | 2-5 | 2 |
| 1-16 | 16 | 2-5 | 2 |
| 1-17 | 17 | 2-5 | 2 |
| 1-18 | 18 | 2-5 | 2 |
| 1-19 | 19 | 2-5 | 2 |
| 1-20 | 20 | 2-5 | 2 |
| 1-21 | 2-diethylamino-4,6-diethoxy-s-trazine according to DE 3,711,263 | 2-5 severe attack on the layer | 2 |
| 1-22 | Hexakis (methoxymethyl) melamine according to EP 133,216 | 1-4 medium to strong attack on the layer | 2 |

These results show that positive processing is possible without difficulties in all cases, whereas negative processing is only possible without severe damage of the converted image areas in the presence of the additives according to the invention.

In a sheet-fed offset printing machine, the number of printed copies of a few of these positive- and negative-processed printing plates were determined, and these are summarized in Table 3.

TABLE 3

| Ex. No. | No. of printed copies with | |
| --- | --- | --- |
| | Positive Processing | Negative Processing |
| 1-5 | 90,000 | 80,000 |
| 1-6 | 90,000 | 80,000 |
| 1-14 | 90,000 | 80,000 |
| 1-17 | 90,000 | 80,000 |
| 1-21 (DE 3,711,263) | 90,000 | 50,000 |
| 1-22 (EP 133,216) | 90,000 | 60,000 |

These results show that in the case of printing plates having radiation-sensitive layers which contain the additives according to the invention, the number of printed copies obtainable with negative processing is almost that obtainable with positive processing. In contrast, the comparison printing plates whose image areas were attacked by the developer during negative processing have a significantly reduced number of printed copies with negative processing as compared to positive processing.

Furthermore, on a number of plates, the processing range in negative processing was determined. This was carried out in such a manner that the plates were processed as described above, except that the temperature of the heat treatment in negative processing was varied. Table 4 shows the results:

TABLE 4

| Ex. No. | Temperature range [°C.] in negative processing |
| --- | --- |
| 1-5 | 105-150 |
| 1-6 | 105-150 |
| 1-10 | 100-150 |
| 1-17 | 105-150 |
| 1-21 (DE 3,711,263) | 100-150 in general attack on the layer |
| 1-22 (EP 133,216) | 130-150 in general attack on the layer |

The results show that the additives according to the invention have a processing range comparable to that of triazine derivatives (DE 3,711,263), which is clearly superior to the additives which cure with acid catalysis.

To test long term stability, the plates were stored in a coating drying cabinet at 100° C. At intervals of 0.5 hours, samples were removed and positively processed as described above. Storage stability is taken to be the value of the storage time up to which faultless processing, i.e., unimpaired development behavior, was possible. The test was discontinued after 3 hours. The results are shown in Table 5.

TABLE 5

| Ex. No. | Storage stability [hours] |
| --- | --- |
| 1-5 | >3 |
| 1-6 | >3 |
| 1-10 | >3 |
| 1-14 | >3 |
| 1-17 | >3 |
| 1-21 (DE 3,711,263) | >3 |
| 1-22 (EP 133,216) | 2 |

The values show that the storage stability of the layers obtained with additives according to the invention is significantly higher than that of the additives which cure with acid catalysis and thus fulfills the practical requirements.

EXAMPLE 2

A coating solution is prepared from

| | |
|---|---|
| 1.700 pbw | of the esterification product from 1 mol of 2,3,4-trihydroxybenzophenone and 1 mol of 4-chlorosulfonyl-1,2-naphthoquinone-2-diazide, |
| 0.600 pbw | of the additive according to Table 3, |
| 8.500 pbw | of a cresol-formaldehyde novolak having a softening point of 127–145° C., |
| 0.060 pbw | of 2,4-bis(trichloromethyl)-6-p-stilbenyl-s-triazine, |
| 0.070 pbw | of Crystal Violet, C.I. 42555, in |
| 70.00 pbw | of propylene glycol monomethyl ether, and |
| 70.00 pbw | of tetrahydrofuran |

The solutions are applied to an aluminum foil treated as in Example 1 by spin-coating and dried, resulting in a layer thickness of 2 μm.

The same tests as in Example 1 are carried out under the same conditions and with the same developer. Table 6 shows the results.

TABLE 6

| Example No. | Additive No. (Table 1) | Continuous tone wedge rating in Negative Processing | Continuous tone wedge rating in Positive Processing | Temperature range in negative processing | Storage stability [hours] | Number of copies in positive processing | Number of copies in negative processing |
|---|---|---|---|---|---|---|---|
| 2-1 | 5 | 1–4 | 3 | 110–150 | >3 | n.d. | n.d. |
| 2-2 | 6 | 1–4 | 3 | 110–150 | >3 | 90,000 | 80,000 |
| 2-3 | 16 | 1–4 | 3 | 110–150 | >3 | n.d. | n.d. |
| 2-4 | 17 | 1–4 | 3 | 110–150 | >3 | 90,000 | 80,000 |
| 2-5 | 18 | 1–4 | 3 | 110–150 | >3 | 90,000 | 80,000 |
| 2-6 | 2-diethyl-amino-4,6-diethoxy-s-triazine | 1–4 strong attack on the layer | 3 | 110–150 | >3 | 90,000 | 50,000 |
| 2-7 | Hexakis-methoxy-methyl-melamine | 1–4 attack on the layer | 3 | 130–150 | >2 | 90,000 | 60,000 |

The results of this test series clearly shows that when a strongly alkaline developer is used, the additives according to the invention produce the best overall behavior in negative processing.

What is claimed is:

1. A normally positive-working radiation-sensitive mixture, consisting essentially of, in admixture:
   from 50 to 85% by weight, relative to the weight of the non-volatile components of the radiation-sensitive mixture, of a binder that is a polycondensation product or polymer having free phenolic hydroxyl groups, said binder being insoluble in water and soluble in aqueous/alkaline solutions;
   a 1,2-quinone diazide; and
   at least one urethane compound in an amount sufficient to diminish the developer solubility of exposed regions of a layer of said mixture coated on a substrate when said layer is subjected to heat treatment, subsequently blanket-exposed and finally developed with a developer solution to produce a negative image, said at least one urethane represented by formula I:

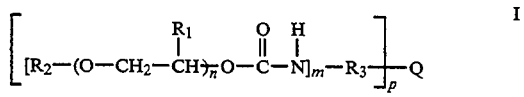

in which
   $R_1$ is hydrogen or methyl,
   $R_2$ is hydrogen, alkyl, substituted or unsubstituted aryl, or substituted or unsubstituted arylaminocarbonyl,
   $R_3$ is substituted or unsubstituted arylene or arylenealkylene,
   Q is hydrogen, carbonyl, oxygen, sulfur, sulfonyl, $-CH_{4-p}$, or $-CR_5R_6$ in which $R_5$ and $R_6$ can be identical or different and are selected from the group consisting of hydrogen, alkyl and aryl,
   m is 1, 2 or 3,
   n is at least 1 and not more than 50, and
   is 1, 2 or 3.

2. A mixture as claimed in claim 1, wherein
   $R_1$ is hydrogen or methyl,
   $R_2$ is hydrogen, $C_1$–$C_2$-alkyl, phenyl, naphthyl, or phenylaminocarbonyl, which can be substituted by alkyl,
   $R_3$ is phenylene, which can be substituted by alkyl,
   Q is hydrogen or methylene,
   m is 1 or 2,
   n is at least 3 and not more than 25, and
   p is 1 or 2.

3. A mixture as claimed in claim 1, wherein
   $R_1$ is hydrogen,
   $R_2$ is phenyl, phenylaminocarbonyl, which can be substituted by alkyl,
   $R_3$ is phenylene,
   Q is hydrogen,
   m is 1,
   n is at least 3 and not more than 25, and
   p is 1.

4. A radiation-sensitive mixture as claimed in claim 1, comprising between about 0.5 and 30 percent by weight, relative to the weight of the non-volatile components of the mixture, of compounds of the formula I.

5. A radiation-sensitive mixture as claimed in claim 2, wherein the urethane compound comprises about 0.5 to 30 percent by weight, relative to the weight of the non-volatile components of the radiation-sensitive mixture.

6. A radiation-sensitive mixture as claimed in claim 1, wherein the 1,2-quinone diazide is a 1,2-naphthoquinone-2-diazide derivative which has an electronegative substituent in the 4- or 5-position.

7. A radiation-sensitive mixture as claimed in claim 6, wherein the electronegative substituent is an aryloxysulfonyl group.

8. A radiation-sensitive mixture as claimed in claim 1, wherein the binder is a polycondensation product or polymer having a phenolic hydroxyl group content in a range from about 1 to 10 mmol/g of binder.

9. A radiation-sensitive mixture as claimed in claim 1, wherein the urethane compound comprises about 1 to 25 percent by weight, relative to the weight of the non-volatile components of the radiation-sensitive mixture.

10. A radiation-sensitive mixture as claimed in claim 9, wherein the 1,2-quinone diazide comprises about 3 to 50 percent by weight, relative to the overall solid content of the radiation-sensitive mixture.

11. A radiation-sensitive mixture as claimed in claim 9, wherein the 1,2-quinone diazide comprises about 7 to 35 percent by weight, relative to the overall solid content of the radiation-sensitive mixture.

12. A radiation-sensitive mixture as claimed in claim 1, wherein Q is hydrogen, sulfur, or $-CH_{4-p}$, or $-CR_5R_6$ in which $R_5$ and $R_6$ can be identical or different and are selected from the group consisting of hydrogen, alkyl and aryl.

13. A radiation-sensitive mixture as claimed in claim 12, wherein n in Formula I is not more than 25.

14. A radiation-sensitive mixture as claimed in claim 13, wherein the urethane compound comprises not more than 25 percent by weight, relative to the weight of the non-volatile components of the radiation-sensitive mixture.

15. A radiation-sensitive recording material comprising:
 a substrate; and
 a radiation-sensitive layer of a mixture as claimed in claim 1 coated on said substrate.

* * * * *